(12) United States Patent
Kim et al.

(10) Patent No.: US 12,336,394 B2
(45) Date of Patent: Jun. 17, 2025

(54) DISPLAY DEVICE

(71) Applicant: LG DISPLAY CO., LTD., Seoul (KR)

(72) Inventors: YoungJin Kim, Paju-si (KR); Jonghyuk Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 469 days.

(21) Appl. No.: 17/833,333

(22) Filed: Jun. 6, 2022

(65) Prior Publication Data
US 2023/0157090 A1 May 18, 2023

(30) Foreign Application Priority Data
Nov. 12, 2021 (KR) .................. 10-2021-0155667

(51) Int. Cl.
*H10K 59/126* (2023.01)
*H10K 59/121* (2023.01)
*H10K 59/131* (2023.01)

(52) U.S. Cl.
CPC ....... *H10K 59/126* (2023.02); *H10K 59/1213* (2023.02); *H10K 59/131* (2023.02)

(58) Field of Classification Search
CPC .... H01L 23/552–556; H01L 23/60–62; H10K 59/126; H10K 50/10–88; H10K 59/10–95; G09G 2330/04–045; H10H 20/83–8316; H10H 29/832–8321; H10H 29/32; H10D 20/32
See application file for complete search history.

(56) References Cited

U.S. PATENT DOCUMENTS

| | | | |
|---|---|---|---|
| 11,049,436 B1 * | 6/2021 | Shin | G09G 3/2092 |
| 2016/0161776 A1 * | 6/2016 | Wang | G02F 1/13454 349/43 |
| 2018/0374955 A1 * | 12/2018 | Yoshida | G02F 1/134363 |
| 2019/0237533 A1 * | 8/2019 | Kim | H01L 27/0292 |
| 2020/0272001 A1 * | 8/2020 | Kameda | G02F 1/13338 |
| 2024/0172517 A1 * | 5/2024 | Zeng | H10K 59/131 |

\* cited by examiner

*Primary Examiner* — Amar Movva
*Assistant Examiner* — Eric Manuel Mulero Flores
(74) *Attorney, Agent, or Firm* — Birch, Stewart, Kolasch & Birch, LLP

(57) ABSTRACT

A display apparatus can include a display panel including an active area and a non-active area, the active area including a plurality of sub-pixels; and a multilayer shielding line disposed in the non-active area, the multilayer shielding line at least partially surrounding the active area, in which the multilayer shielding line includes a plurality of conductive patterns that are disposed on different layers within the display panel, the plurality of conductive patterns are electrically connected with each other, and the multilayer shielding line can prevent an influence of an electric field generated on a surface of the display apparatus from damaging other circuit components located within the display area.

18 Claims, 14 Drawing Sheets

DISPLAY DEVICE

CROSS-REFERENCE TO RELATED APPLICATIONS

This application claims priority to Korean Patent Application No. 10-2021-0155667, filed in the Republic of Korea on Nov. 12, 2021, the entire contents of which are hereby incorporated by reference for all purposes as if fully set forth into the present application.

BACKGROUND

Technical Field

Embodiments of the present disclosure relate to a display device (or a display apparatus).

Description of the Related Art

As the information society develops even further, demands for display devices displaying images are increasing, and various types of display devices, such as liquid crystal displays and organic light emitting displays, are used.

In order to provide more functionality to the user, the display device may provide a function of recognizing a user's touch on the display panel and performing input processing based on the recognized touch.

The user may perform a touch operation through a gesture such as repeatedly touching or sweeping the surface of the display device.

Due to repeated touches, the surface of the display device may become electrically charged, and when the surface of the display device is charged, an electric field may be formed around the display device. Such an electric field may also affect an operation of one or more transistors or other circuit components located inside the display device. Accordingly, a problem of deteriorating display quality may occur when internal components become damaged by the electric field generated on the surface of the display device.

SUMMARY OF THE DISCLOSURE

The present disclosure may provide a robust display device that is protected from the influence of an electric field.

According to aspects of the present disclosure, there is a display device including a substrate, a light emitting device disposed on the substrate and disposed in a sub-pixel of a display area, and a multilayer shielding line disposed on the substrate and electrically connected to a plurality of conductive patterns disposed on different layers with an interlayer insulating layer interposed therebetween in a non-display area around the display area. For example, certain internal electrical components (e.g., transistors, source-drain metal patterns, metal vias disposed within contact holes, etc.) located along the outer edges around the display area, deep within the display device can be repurposed and electrically connected with each other and at least one metal layer, in order to form a multilayer shielding line that can receive a same voltage and distribute that same voltage along the outer edges and deep within the display device at different layers, in order to prevent an influence of an electric field generated on a surface of the display device from damaging other circuit components located within the display area. Also, the multilayer shielding line can perform an additional function of detecting cracks in the display device, by measuring a voltage drop on the multilayer shielding line.

According to embodiments of the present disclosure, it is possible to provide a robust display device that is protected from the influence of an electric field.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
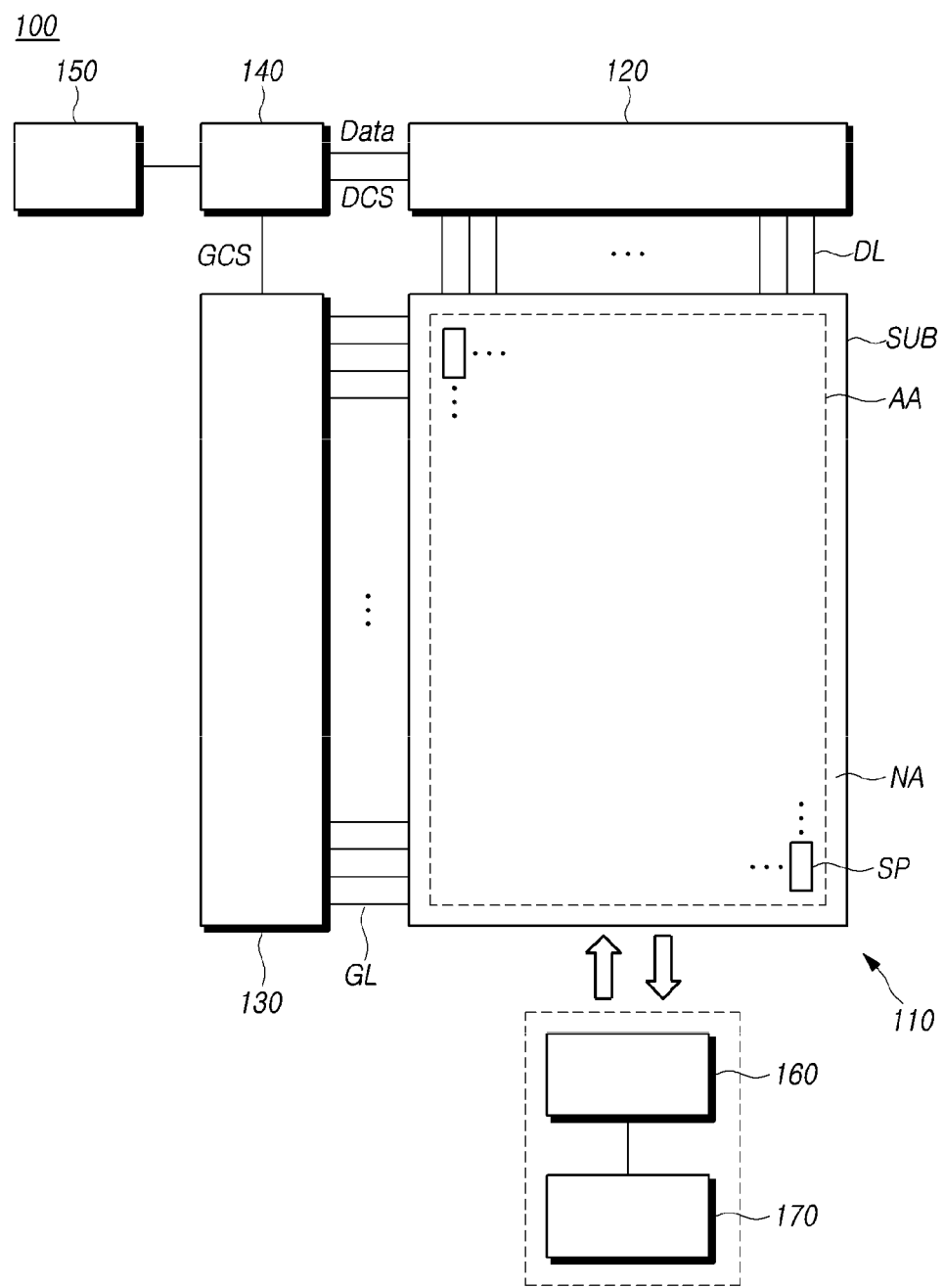
FIG. 1 is a system configuration diagram of a display device (or display apparatus) according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including," "having," "containing," "constituting" "make up of," and "formed of" used herein are generally intended to allow other components to be added unless the terms are used with the term "only". As used herein, singular forms are intended to include plural forms unless the context clearly indicates otherwise.

Terms, such as "first," "second," "A," "B," "(A)," or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element can be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of a display device (or display apparatus) according to embodiments of the present disclosure.

Referring to FIG. 1, a display device 100 according to embodiments of the present disclosure can include a display panel 110 and a display driving circuit as components for displaying an image.

The display driving circuit is a circuit for driving the display panel 110 and can include a data driving circuit 120 (e.g., a data driver), a gate driving circuit 130 (e.g., a gate driver or scan driver), and a display controller 140.

The display panel 110 can include a display area AA in which an image is displayed and a non-display area NA in which an image is not displayed. The non-display area NA can be an outer area of the display area AA, and is also referred to as a bezel area. The whole or a part of the non-display area NA can be an area visible from the front surface of the display device 100, or can be an area bent and invisible from the front surface of the display device 100.

The display panel 110 can include a substrate SUB and a plurality of sub-pixels SP disposed on the substrate SUB. In addition, the display panel 110 can further include various types of signal lines to drive a plurality of sub-pixels SP.

The display device 100 according to the example configurations of the present disclosure can be a liquid crystal display device or the like, or can be a light emitting display device in which the display panel 110 emits light by itself (e.g., no backlight required). When the display device 100 according to configurations of the present disclosure is a self-luminous display device, each of a plurality of sub-pixels SP can include a light emitting device (e.g., OLEDs).

For example, the display device 100 according to configurations of the present disclosure can be an organic light emitting display device in which a light emitting device is implemented as an organic light emitting diode (OLED). As another example, the display device 100 according to the example configurations of the present disclosure can be an inorganic light emitting display device in which a light emitting device is implemented as an inorganic-based light emitting diode (e.g., micro LEDs). As another example, the display device 100 according to embodiments of the present disclosure can be a quantum dot display device implemented as a quantum dot, which is a semiconductor crystal in which the light emitting device emits light by itself.

The structure of each of a plurality of sub-pixels SP can vary according to the type of the display device 100. For example, when the display device 100 is a self-luminous display device in which the sub-pixel SP emits light by itself, each sub-pixel SP can include a light emitting device that emits light by itself, one or more transistors, and one or more capacitors.

For example, various types of signal lines can include a plurality of data lines DL that transmit data signals (also referred to as data voltages or image signals) and a plurality of gate lines GL that transmit gate signals (also referred to as scan signals).

A plurality of data lines DL and a plurality of gate lines GL can cross each other. Each of a plurality of data lines DL can be disposed to extend in the first direction. Each of a plurality of gate lines GL can be disposed to extend in the second direction.

Here, the first direction can be a column direction, and the second direction can be a row direction. Alternatively, the first direction can be a row direction and the second direction can be a column direction.

The data driving circuit 120 is a circuit configured to drive a plurality of data lines DL, and can output data signals to the plurality of data lines DL. The gate driving circuit 130 is a circuit configured to drive a plurality of gate lines GL, and can output gate signals to the plurality of gate lines GL.

The display controller 140 can be a device configured to control the data driving circuit 120 and the gate driving circuit 130. The display controller 140 can control a driving timing for the plurality of data lines DL and a driving timing for the plurality of gate lines GL.

The display controller 140 can supply the data driving control signal DCS to the data driving circuit 120 in order to control the data driving circuit 120. The display controller 140 can supply a gate driving control signal GCS to the gate driving circuit 130 in order to control the gate driving circuit 130.

The display controller 140 can receive input image data from the host system 150 and supply the image data to the data driving circuit 120 based on the input image data.

The data driving circuit 120 can supply data signals to the plurality of data lines DL according to driving timing control of the display controller 140.

The data driving circuit 120 can receive digital image data from the display controller 140, convert the received image data into analog data signals, and output the converted data to the plurality of data lines DL.

The gate driving circuit 130 can supply gate signals to the plurality of gate lines GL according to timing control of the display controller 140. The gate driving circuit 130 can receive a first gate voltage corresponding to a turn-on level voltage and a second gate voltage corresponding to a turn-off level voltage together with various gate driving control signals GCS to generate gate signals, and supply the generated gate signals to the plurality of gate lines GL.

For example, the data driving circuit 120 is connected to the display panel 110 in a tape automated bonding (TAB) manner, or is connected to a bonding pad of the display panel 110 in a chip-on-glass method (COG) manner or a chip-on-panel method (COP) manner, or is connected to the display panel 110 in a chip-on-film method (COF) manner.

The gate driving circuit 130 is connected to the display panel 110 in a tape automated bonding (TAB) manner, or is connected to a bonding pad of the display panel 110 in a chip-on-glass method (COG) manner or a chip-on-panel method (COP) manner, or is connected to the display panel 110 in a chip-on-film method (COF) manner. Alternatively, the gate driving circuit 130 can be formed in the non-display area NA of the display panel 110 in a gate-in-panel (GIP) type. The gate driving circuit 130 can be disposed on the substrate SUB or connected to the substrate SUB. For example, when the gate driving circuit 130 is of the gate-in-panel (GIP) type, the gate driving circuit 130 can be disposed in the non-display area NA of the substrate SUB. The gate driving circuit 130 can be connected to the substrate in the situation of a chip-on-glass (COG) type, a chip-on film (COF) type, or the like.

In addition, at least one driving circuit of the data driving circuit 120 and the gate driving circuit 130 can be disposed in the display area AA of the display panel 110. For example, at least one driving circuit of the data driving circuit 120 and the gate driving circuit 130 can be disposed not to overlap the sub-pixels SP, or can be disposed to partially or entirely overlap the sub-pixels SP.

The data driving circuit 120 can be connected to one side (e.g., an upper side or a lower side) of the display panel 110. Depending on the driving method, the panel design method, etc., the data driving circuit 120 can be connected to opposite sides (e.g., upper and lower sides) of the display panel 110 or can be connected to two or more side surfaces of the four sides of the display panel 110.

The gate driving circuit 130 can be connected to one side (e.g., left or right side) of the display panel 110. Depending on the driving method, the panel design method, etc., the gate driving circuit 130 can be connected to opposite sides (e.g., left and right side) of the display panel 110, or can be connected to two or more side surfaces of the four sides of the display panel 110.

The display controller 140 can be implemented as a separate component from the data driving circuit 120, or can be integrated with the data driving circuit 120 to be implemented as an integrated circuit.

The display controller 140 can be a timing controller used in display technology, a control device capable of further performing other control functions including the timing controller, a control device different from the timing controller, or a circuit in the control device. The display controller 140 can be implemented with various circuits or electronic components, such as an integrated circuit (IC), a field programmable gate array (FPGA), an application specific integrated circuit (ASIC), or a processor.

The display controller 140 can be electrically connected to the data driving circuit 120 and the gate driving circuit 130 through a printed circuit board (PCB) or a flexible printed circuit board (FPCB).

The display controller 140 can transmit and receive signals to and from the data driving circuit 120 according to one or more predetermined interfaces. Here, for example, the interface can include a low voltage differential signaling (LVDS) interface, an EPI interface, or a serial personal interface (SPI).

The display device 100 according to configurations of this disclosure can include a touch sensor and a touch sensing circuit that senses the touch sensor to detect whether a touch has occurred by a touch object, such as a finger or a pen, or detects a touch position.

The touch sensing circuit can include a touch driving circuit 160 that drives and senses a touch sensor to generate and output touch sensing data, and a touch controller 170 that can detect occurrence of a touch or detect a touch position using the touch sensing data.

The touch sensor can include a plurality of touch electrodes. The touch sensor can further include a plurality of touch lines for electrically connecting the plurality of touch electrodes and the touch driving circuit 160.

The touch sensor can exist outside the display panel 110 in the form of a touch panel, or can exist inside the display panel 110. When the touch sensor exists outside the display panel 110 in the form of a panel, the touch sensor is referred to as an external type (or an add-on type). When the touch sensor is the external type, the touch panel and the display panel 110 can be separately manufactured and coupled during an assembly process. The external touch panel can include a substrate for a touch panel and the plurality of touch electrodes on the substrate for the touch panel.

When the touch sensor is present inside the display panel 110, the touch sensor is referred to as an embedded type (or an in-cell type or a built-in type). When the touch sensor is the embedded type, the touch sensor can be formed on the substrate SUB together with signal lines and electrodes related to display driving during the manufacturing process of the display panel 110.

The touch driving circuit 160 can supply a touch driving signal to at least one of the plurality of touch electrodes, and can sense at least one of the plurality of touch electrodes to generate touch sensing data.

The touch sensing circuit can perform touch sensing using a self-capacitance sensing method or a mutual-capacitance sensing method.

When the touch sensing circuit performs touch sensing by the self-capacitance sensing method, the touch sensing circuit can perform touch sensing based on capacitance between each touch electrode and a touch object (e.g., a finger or a pen, etc.).

According to the self-capacitance sensing method, each of the plurality of touch electrodes can serve as a driving touch electrode or a sensing touch electrode. Touch driving circuit 160 can drive all or part of the plurality of touch electrodes and sense all or part of the plurality of touch electrodes.

When the touch sensing circuit performs touch sensing by a mutual-capacitance sensing method, the touch sensing circuit can perform touch sensing based on capacitance between touch electrodes.

According to the mutual-capacitance sensing method, multiple touch electrodes are divided into driving touch electrodes and sensing touch electrodes. The touch driving circuit 160 can drive the driving touch electrodes and sense the sensing touch electrodes.

The touch driving circuit 160 and the touch controller 170 included in the touch sensing circuit can be implemented as separate devices or can be implemented as one device. In addition, the touch driving circuit 160 and the data driving circuit 120 can be implemented as separate devices or can be implemented as one device.

The display device 100 can further include a display driving circuit and/or a power supply circuit that supplies various types of power to the touch sensing circuit.

The display device 100 according to embodiments of the present disclosure can be a mobile terminal, such as a smartphone or a tablet, a monitor or a television (TV) of various sizes, and can be a display device of various types and sizes capable of displaying information or images.

Figure 2:
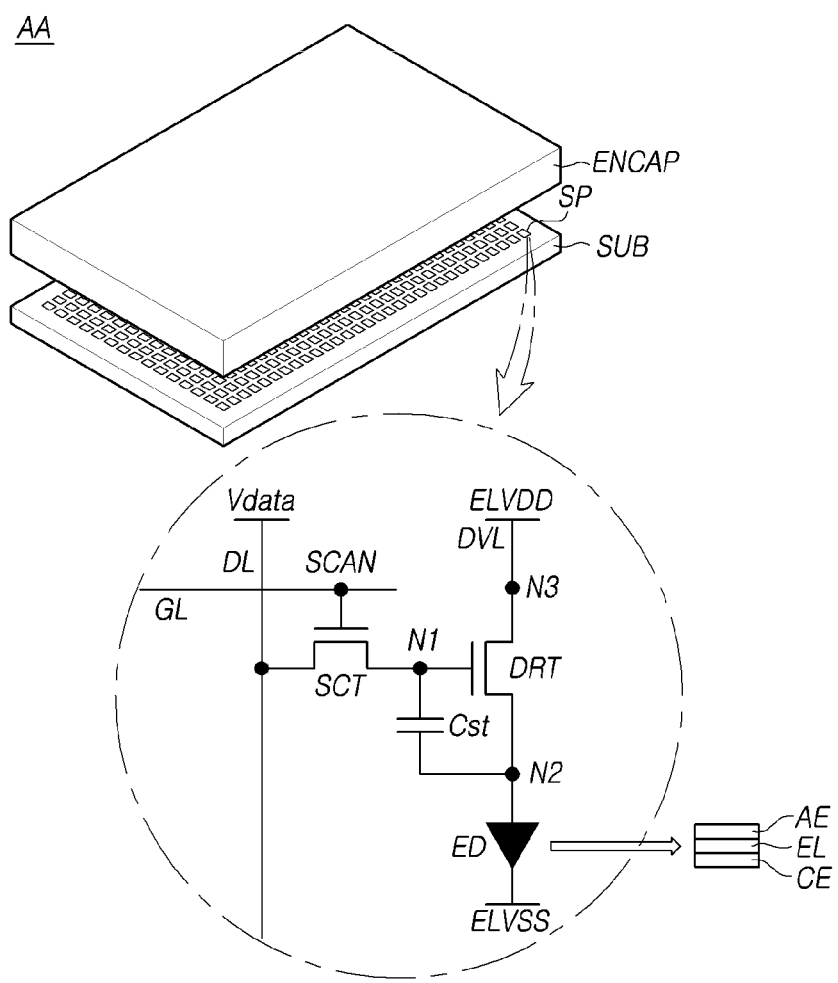
FIG. 2 is an equivalent circuit of a sub-pixel in a display panel according to embodiments of the present disclosure.

FIG. 2 is an equivalent circuit of a sub-pixel in a display panel according to embodiments of the present disclosure.

Referring to FIG. 2, each of the sub-pixels SP disposed in the display area AA of the display panel 110 (see FIG. 1) can include a light emitting device ED, a driving transistor DRT configured to drive the light emitting device ED, a scan transistor SCT configured to transfer data voltage Vdata to the first node N1 of the driving transistor DRT, and a storage capacitor Cst configured to maintain a constant voltage for one frame.

The driving transistor DRT can include a first node N1 to which the data voltage Vdata is applied, a second node N2 electrically connected to the light emitting device ED, and a third node N3 to which a high potential common voltage ELVDD is applied from the driving voltage line DVL. In the driving transistor DRT, the first node N1 can be a gate node, the second node N2 can be a source node or a drain node, and the third node N3 can be a drain node or a source node.

The light emitting device ED can include an anode electrode AE, a light emitting layer EL, and a cathode electrode CE. The anode electrode AE can be a pixel electrode disposed in each sub-pixel SP, and can be electrically connected to the second node N2 of the driving transistor DRT of each sub-pixel SP. The cathode electrode CE can be a common electrode commonly disposed in the plurality of sub-pixels SP, and a low potential common voltage ELVSS can be applied to the cathode electrode CE.

For example, the anode electrode AE can be a pixel electrode, and the cathode electrode CE can be a common electrode. Conversely, the anode electrode AE can be a common electrode, and the cathode electrode CE can be a pixel electrode. Hereinafter, for convenience of description, it is assumed that the anode electrode AE is a pixel electrode and the cathode electrode CE is a common electrode.

For example, the light emitting device ED can be an organic light emitting diode (OLED), an inorganic light emitting diode, or a quantum dot light emitting device. In this situation, when the light emitting device ED is an organic light emitting diode, the light emitting layer EL in the light emitting device ED can include an organic light emitting layer including an organic material.

The scan transistor SCT is turned on and off by a scan signal SCAN, which is a gate signal applied through the gate line GL. The scan transistor SCT can be configured to switch an electrical connection between the first node N1 and the data line DL of the driving transistor DRT.

The storage capacitor Cst can be electrically connected between the first node N1 and the second node N2 of the driving transistor DRT.

As illustrated in FIG. 2, each sub-pixel SP can have a 2T (Transistor) 1C (Capacitor) structure including two transistors DRT and SCT and one capacitor Cst, and in some situations, can further include one or more transistors or can further include one or more capacitors.

The storage capacitor Cst may not be a parasitic capacitor (e.g., Cgs, Cgd) that can exist between the first node N1 and the second node N2 of the driving transistor DRT, but can be an external capacitor intentionally designed outside of the driving transistor DRT.

Each of the driving transistor DRT and the scan transistor ACT can be an n-type transistor or a p-type transistor.

Since the circuit elements (particularly, the light emitting device ED) in each sub-pixel SP are vulnerable to external moisture or oxygen, an encapsulation layer ENCAP can be disposed on the display panel 110 to prevent external moisture or oxygen from penetrating into the circuit elements (particularly the light emitting device ED). The encapsulation layer ENCAP can be disposed to cover the light emitting devices ED.

Figure 3:
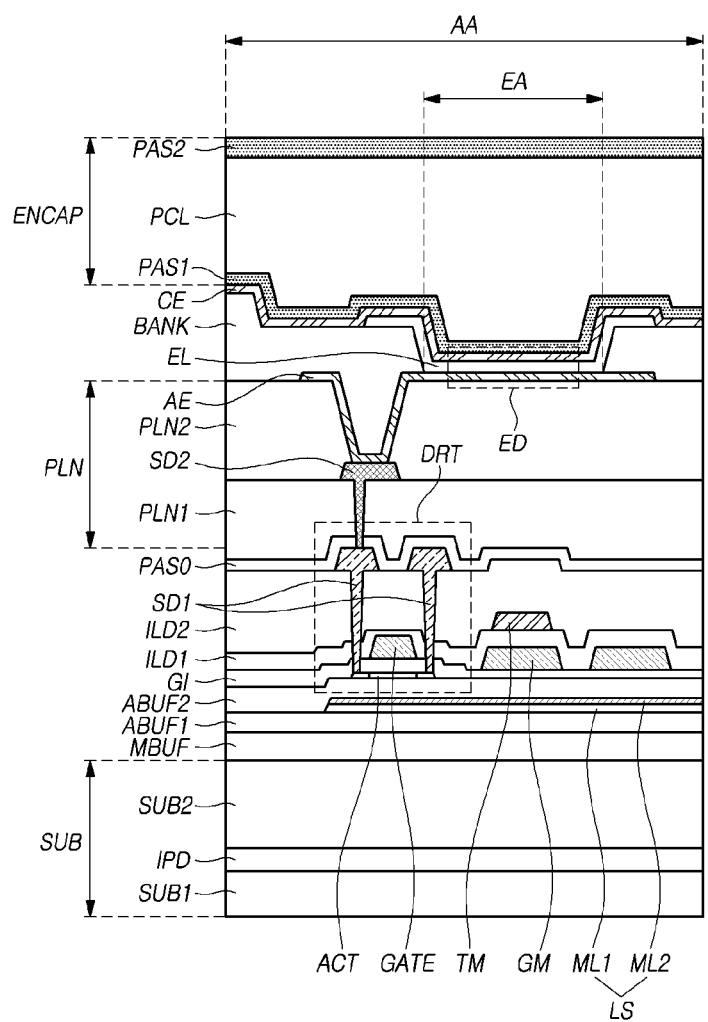
FIG. 3 is a cross-sectional view of a display area of a display panel according to embodiments of the present disclosure.

FIG. 3 is a cross-sectional view of a display area of a display panel according to embodiments of the present disclosure.

FIG. 3 is a cross-sectional view of the display panel 110 when the touch sensor is present outside the display panel 110 in the form of a touch panel.

Referring to FIG. 3, the substrate SUB can include a first substrate SUB1, an interlayer insulating layer IPD, and a second substrate SUB2. The interlayer insulating layer IPD can be positioned between the first substrate SUB1 and the second substrate SUB2. Since the substrate SUB is composed of the first substrate SUB1, the interlayer insulating layer IPD, and the second substrate SUB2, moisture penetration can be prevented. For example, the first substrate SUB1 and the second substrate SUB2 can be polyimide (PI) substrates. The first substrate SUB1 can be referred to as a primary polyimide (PI) substrate, and the second substrate SUB2 can be referred to as a secondary polyimide (PI) substrate.

Referring to FIG. 3, various patterns (ACT, SD1, GATE), various insulating layers (MBUF, ABUF1, ABUF2, GI, ILD1, ILD2, PAS0), and various metal patterns (TM, GM, ML1, ML2) can be disposed on a substrate SUB.

Referring to FIG. 3, a multi-buffer layer MBUF can be disposed on the second substrate SUB2, and a first active buffer layer ABUF1 can be disposed on the multi-buffer layer MBUF.

A first metal layer ML1 and a second metal layer ML2 can be disposed on the first active buffer layer ABUF1. Here, the first metal layer ML1 and the second metal layer ML2 can be a light shield layer LS that shields light.

A second active buffer layer ABUF2 can be disposed on the first metal layer ML1 and the second metal layer ML2. An active layer ACT of the driving transistor DRT can be disposed on the second active buffer layer ABUF2.

A gate insulating layer GI can be disposed to cover the active layer ACT.

A gate electrode GATE of the driving transistor DRT can be disposed on the gate insulating layer GI. In this situation, a gate material layer GM can be disposed on the gate insulating layer GI together with the gate electrode GATE of the driving transistor DRT at a position different from the formation position of the driving transistor DRT.

The first interlayer insulating layer ILD1 can be disposed to cover the gate electrode GATE and the gate material layer GM. A metal pattern TM can be disposed on the first interlayer insulating layer ILD1. The metal pattern TM can be disposed differently from the formation position of the driving transistor DRT. The second interlayer insulating layer ILD2 can be disposed while covering the metal pattern TM on the first interlayer insulating layer ILD1.

Two first source-drain electrode material patterns SD1 can be disposed on the second interlayer insulating layer ILD2. One of the two first source-drain electrode material patterns SD1 is a source node of the driving transistor DRT, and the other is a drain node of the driving transistor DRT.

The two first source-drain electrode material patterns SD1 can be electrically connected to one side and the other side of the active layer ACT through a contact hole of the second interlayer insulating layer ILD2, the first interlayer insulating layer ILD1, and the gate insulating layer GI.

A portion of the active layer ACT overlapping the gate electrode GATE is a channel region. One of the two first source-drain electrode material patterns SD1 can be connected to one side of the channel region in the active layer ACT, and the other of the two first source-drain electrode material patterns SD1 can be connected to the other side of the channel region in the active layer ACT.

A passivation layer PAS0 is disposed to cover the two first source-drain electrode material patterns SD1. A planarization layer PLN can be disposed on the passivation layer PAS0. The planarization layer PLN can include a first planarization layer PLN1 and a second planarization layer PLN2.

The first planarization layer PLN1 can be disposed on the passivation layer PAS0.

A second source-drain electrode material pattern SD2 can be disposed on the first planarization layer PLN1. The second source-drain electrode material pattern SD2 can be connected to one of the two first source-drain electrode material patterns SD1 (corresponding to the second node N2 of the driving transistor DRT in the sub-pixel SP of FIG. 2) through the contact hole of the first planarization layer PLN1.

The second planarization layer PLN2 can be disposed to cover the second source-drain electrode material pattern SD2. The light emitting device ED can be disposed on the second planarization layer PLN2.

Looking at the stacked structure of the light emitting device ED, an anode electrode AE can be disposed on the second planarization layer PLN2. The anode electrode AE can be electrically connected to the second source-drain electrode material pattern SD2 through a contact hole of the second planarization layer PLN2.

The bank BANK can be disposed to cover a portion of the anode electrode AE. A portion of the bank BANK corresponding to a light emitting area EA of the sub-pixel SP can be opened.

A part of the anode electrode AE can be exposed to the opening (open part) of the bank BANK. An emission layer EL can be located on the side surface of the bank BANK and the opening (open portion) of the bank BANK. All or a part of the emission layer EL can be positioned between adjacent banks BANK.

In the opening of the bank BANK, the emission layer EL can be in contact with the anode electrode AE. A cathode electrode CE can be disposed on the emission layer EL.

The light emitting device ED can be formed by the anode electrode AE, the light emitting layer EL, and the cathode electrode CE. The emission layer EL can include an organic layer.

An encapsulation layer ENCAP can be disposed on the above-described light emitting device ED.

The encapsulation layer ENCAP can have a single layer structure or a multilayer structure. For example, as illustrated in FIG. 3, the encapsulation layer ENCAP can include a first encapsulation layer PAS1, a second encapsulation layer PCL, and a third encapsulation layer PAS2.

For example, the first encapsulation layer PAS1 and the third encapsulation layer PAS2 can be inorganic layers, and the second encapsulation layer PCL can be one or more organic layers. Among the first encapsulation layer PAS1, the second encapsulation layer PCL, and the third encapsulation layer PAS2, the second encapsulation layer PCL, which is an organic layer, is the thickest. The second encapsulation layer PCL can serve as a planarization layer.

The first encapsulation layer PAS1 can be disposed on the cathode electrode CE, and can be disposed closest to the light emitting device ED. The first encapsulation layer PAS1 can be formed of an inorganic insulating material capable of low-temperature deposition. The first encapsulation layer PAS1 can be formed of an inorganic insulating material capable of low-temperature deposition. For example, the first encapsulation layer PAS1 can be silicon nitride (SiNx), silicon oxide (SiOx), silicon oxynitride (SiON), or aluminum oxide ($Al_2O_3$). Since the first encapsulation layer PAS1 is deposited in a low temperature atmosphere, the first encapsulation layer PAS1 can prevent damage to the emission layer EL including an organic material vulnerable to the high temperature atmosphere during the deposition process.

The second encapsulation layer PCL can be formed to have a smaller area than the first encapsulation layer PAS1. In this situation, the second encapsulation layer PCL can be formed to expose both ends of the first encapsulation layer PAS1. The second encapsulation layer PCL serves as a buffer for relieving stress between each layer due to bending of the display device 100, and can also serve to enhance planarization performance. For example, the second encapsulation layer PCL can be an acrylic resin, an epoxy resin, polyimide, polyethylene, or silicon oxycarbon (SiOC), and can be formed of an organic insulating material. For example, the second encapsulation layer PCL can be formed through an inkjet method.

The third inorganic encapsulation layer PAS2 can be formed to cover an upper surface and a side surface of each of the second encapsulation layer PCL and the first encapsulation layer PAS1 on the substrate SUB on which the second encapsulation layer PCL is formed. The third encapsulation layer PAS2 can minimize or block penetration of external moisture or oxygen into the first encapsulation layer PAS1 and the second encapsulation layer PCL. For example, the third encapsulation layer PAS2 is formed of an inorganic insulating material such as silicon nitride (SiNx), silicon oxide (SiOx), silicon oxynitride (SiON), or aluminum oxide ($Al_2O_3$).

Figure 4:
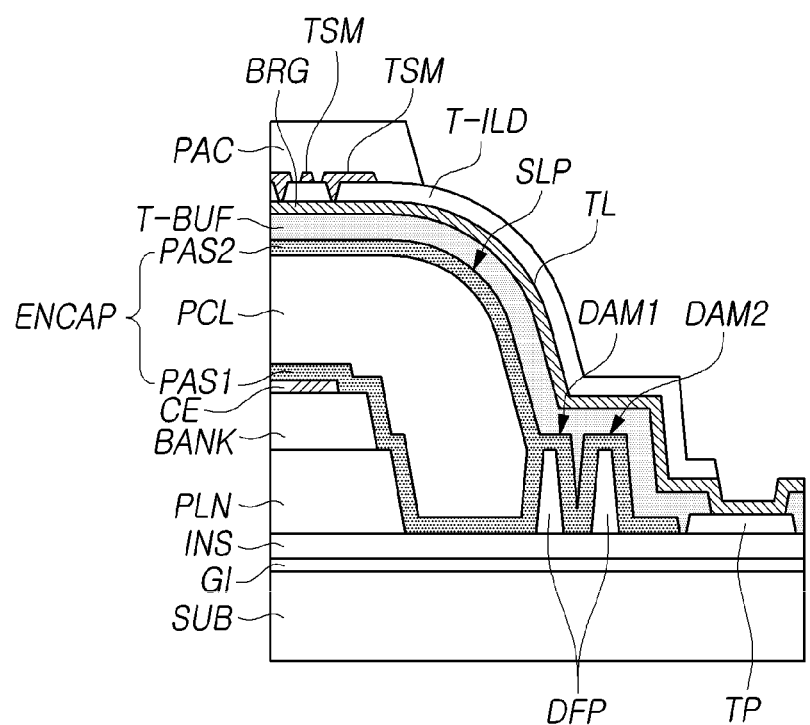
FIG. 4 is a cross-sectional view of an outer edge of a display panel according to embodiments of the present disclosure.

FIG. 4 is a cross-sectional view of an outer edge of a display panel according to embodiments of the present disclosure.

In FIG. 4, a substrate SUB in which the first substrate SUB1 and the second substrate SUB2 are combined is displayed, and a lower portion of the bank BANK is briefly illustrated. In FIG. 4, the first planarization layer PLN1 and the second planarization layer PLN2 are illustrated as one planarization layer PLN, and the second interlayer insulating layer ILD2 and the first interlayer insulating layer ILD1 are illustrated as one interlayer insulating layer INS.

Referring to FIG. 4, the first encapsulation layer PAS1 can be disposed on the cathode electrode CE and can be disposed closest to the light emitting device ED. The second encapsulation layer PCL can be formed to have a smaller area than the first encapsulation layer PAS1. In this situation, the second encapsulation layer PCL can be formed to expose both ends of the first encapsulation layer PAS1.

The third encapsulation layer PAS2 can be formed to cover upper and side surfaces of each of the second encapsulation layer PCL and the first encapsulation layer PAS1 on the substrate SUB on which the second encapsulation layer PCL is formed.

The third encapsulation layer PAS2 minimizes or blocks penetration of external moisture or oxygen into the first encapsulation layer PAS1 and the second encapsulation layer PCL.

Referring to FIG. 4, in order to prevent the encapsulation layer ENCAP from collapsing, one or more dams DAM1 and DAM2 can exist at or near an end point of the inclined surface SLP of the encapsulation layer ENCAP. One or more dams DAM1 and DAM2 can exist at a boundary point between the display area AA and the non-display area NA or can exist near the boundary point.

The one or more dams DAM1 and DAM2 can include the same material as the bank BANK.

Referring to FIG. 4, the second encapsulation layer PCL including an organic material can be disposed only on an inner side surface of the innermost primary dam DAM1. The second encapsulation layer PCL may not exist on the upper portions of all dams DAM1 and DAM2. Alternatively, the second encapsulation layer PCL including an organic material can be disposed on at least the primary dam DAM1 of the primary dam DAM1 and the secondary dam DAM2.

The second encapsulation layer PCL can be disposed to extend to the upper portion of the primary dam DAM1. Alternatively, the second encapsulation layer PCL can be disposed to extend from an upper portion of the primary dam DAM1 to an upper portion of the secondary dam DAM2.

Referring to FIG. 4 again, a touch pad TP to which the touch driving circuit 160 is electrically connected can be disposed on the substrate SUB outside one or more dams DAM1 and DAM2.

A touch line TL can electrically connect a touch sensor metal TSM or a bridge metal BRG constituting the touch electrode disposed in the display area AA to the touch pad TP.

One end of the touch line TL can be electrically connected to the touch sensor metal TSM or the bridge metal BRG, and the other end of the touch line TL can be electrically connected to the touch pad TP.

One end of the touch line TL can be electrically connected to the touch sensor metal TSM or the bridge metal BRG, and the other end of the touch line TL can be electrically connected to the touch pad TP.

As shown in FIG. 4, a protective layer PAC can be disposed to cover the touch sensor on the encapsulation layer ENCAP to protect the touch sensor. The protective layer PAC can be an organic insulating layer.

Referring to FIG. 4, the protective layer PAC can include a mesh-type touch sensor metal TSM. When the touch sensor metal TSM is formed in a mesh type, a plurality of open areas can exist in the touch sensor metal TSM. Each of the plurality of open areas can correspond to the light emitting area of the sub-pixel SP.

Figure 5:
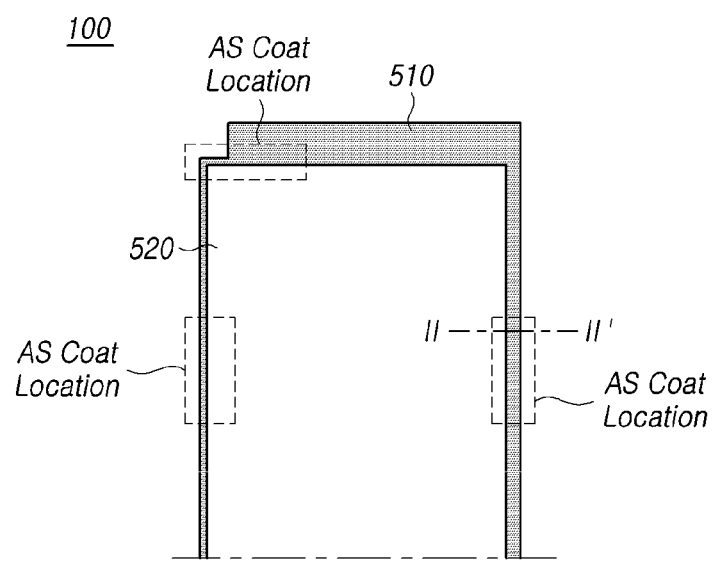
FIG. 5 is a diagram illustrating an example of a ground electrode positioned on a rear surface of a display panel according to an embodiment of the present disclosure.

FIG. 5 is a diagram illustrating an example of a ground electrode positioned on a rear surface of a display panel.

The display device 100, according to the example configurations of the present disclosure, can include a cover glass 510 disposed on the front surface of the display panel 110, and a ground electrode 520 disposed on the rear surface of the display panel 110.

The user of the display device 100 can lightly touch the cover glass 510 for a touch input, or in some situations, rub the cover glass 510.

Due to the above operations, the surface of the cover glass 510 can be charged, and an electric field can be formed on the surface of the cover glass 510. This can cause the display quality to deteriorate in the display device 100 including a field effect transistor (FET).

Accordingly, the display device 100 can include the ground electrode 520 electrically connected to the cover glass 510.

The ground electrode 520 can be disposed on the rear surface of the display panel 110. The ground electrode 520 can include copper (Cu).

The ground electrode 520 can be positioned in at least a partial area of the rear surface of the display panel 110.

The display device 100 can include a conductive material for electrically connecting the cover glass 510 with the ground electrode 520.

The conductive material can be obtained by coating a conductive solution on at least a portion of the cover glass 510. In this situation, the conductive material is also referred to as a ground coating (or an AS coating).

The ground coating can be located on a side surface of the display panel 110. The ground coating can be positioned only on one side surface of the display device 100, but alternatively can be positioned on two or more side surfaces of the display device 100.

Figure 6:
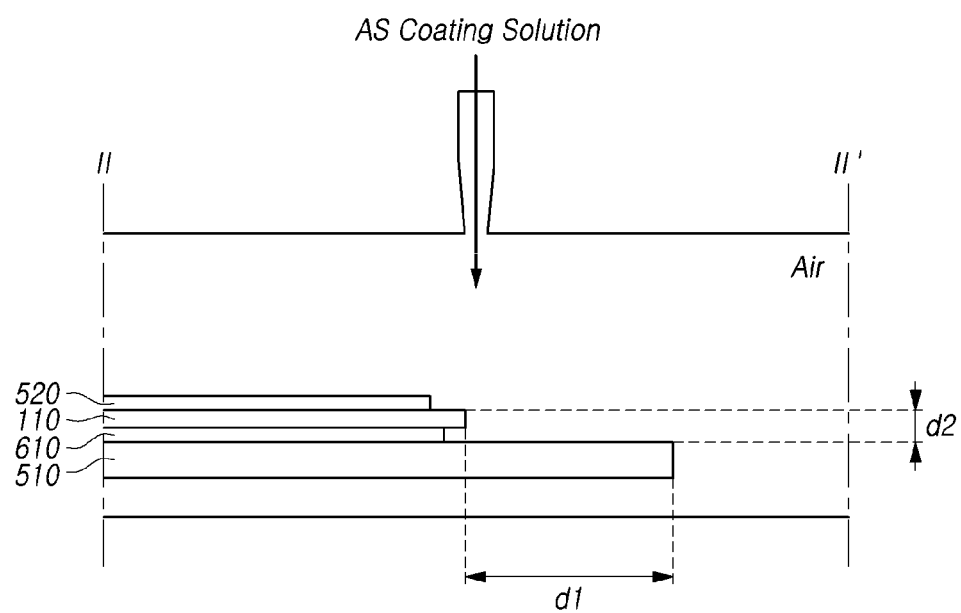
FIG. 6 is a diagram schematically illustrating a grounding process electrically connecting a cover glass to a ground electrode according to an embodiment of the present disclosure.

FIG. 6 is a diagram schematically illustrating a grounding process electrically connecting a cover glass to a ground electrode.

Referring to FIG. 6, the cover glass 510 and the ground electrode 520 can be electrically connected to each other by arranging the conductive material to be connected from the rear surface of the cover glass 520 to the ground electrode 510 in the ground coating process.

This ground coating process can be carried out in air, but can be carried out in other media, for example.

Referring to FIG. 6, the cover glass 510 can be attached to an adhesive member 610 and attached to the front surface of the display panel 110. The adhesive member 610 can be, for example, an Optical Clear Adhesive.

The area of the cover glass 510 can be larger than the area of the display panel 110. The adhesive member 610 can be applied to the front surface of the display panel 110 in an area smaller than the area of the display panel 110. A gap can exist between the end of the adhesive member 610 and the end of the display panel 110. An interval of the first interval d1 can exist between the end of the display panel 110 and the end of the cover glass 510.

Further, the conductive material electrically connecting the cover glass 510 and the ground electrode 520 can be disposed on the rear surface of the cover glass 510 in the form of, for example, a solution. The solution can have viscosity or adhesiveness.

At least a part of the conductive material can be positioned on the rear surface of the cover glass 510 and can be positioned in an area between the first distance d1 from the end of the display panel 110.

Meanwhile, at least a portion of the remaining conductive material can be positioned at one end of the ground electrode 520 or at a rear surface of the ground electrode 520.

The conductive material can connect the cover glass 510 and the ground electrode 520, and can alleviate the formation of a negative electric field on the surface of the cover glass 510.

The ground electrode 520 can be disposed on the rear surface of the display panel 110. For example, the ground electrode 520 can be formed by coating a metal material including copper (Cu) on the rear surface of the display panel 110.

In addition, a step of the second distance d2 can exist between the ground electrodes 520 and the cover glass 510 on the rear surface of the cover glass 510. The second distance d2 can correspond to thicknesses of the adhesive member 610 and the display panel 110.

In the ground coating process, the amount of the solution can be adjusted in consideration of the second distance d2. If the amount of solution is insufficient, or the amount of solution is excessive, ground failure can occur, or the solution can flow to the front surface of the cover glass 510 and overflow can occur.

Figure 7:
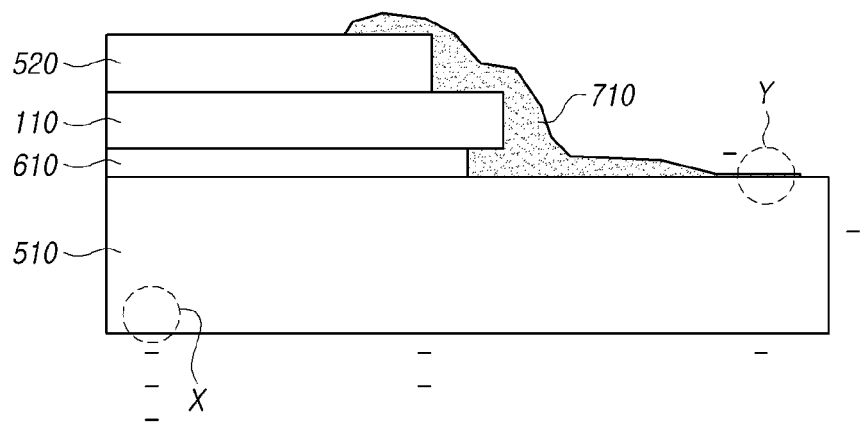
FIG. 7 illustrates a comparative example in which the cover glass is grounded.

FIG. 7 illustrates an example in which the cover glass is normally grounded.

Referring to FIG. 7, the X region can be a central region of a front surface of the cover glass 510. The Y region can be a rear region of the cover glass 510.

When the cover glass 510 is charged, a negative electric field can be formed on the surface of the cover glass 510 by the charge.

The conductive material 710 can electrically connect the cover glass 510 and the ground electrode 520. The conductive material 710 can be positioned on the rear surface of the cover glass 510 and the rear surface of the ground electrode 520. When the conductive material 710 is applied to the rear surface of the ground electrode 520 in the form of a solution, at least a part of the conductive material 710 can exist on the side surface of the ground electrode 520.

When the cover glass 510 and the ground electrode 520 are electrically connected with each other through the conductive material 710, the intensity of the electric field can be particularly weakened on the side and rear surfaces of the cover glass 510.

Referring to FIG. 7, the intensity of the electric field is relatively strong in the front center region X of the cover glass 510, and the intensity of the electric field is relatively weak in the rear region Y of the cover glass 510.

A plurality of transistors affected by the electric field can be disposed on the display panel 110, and such electric fields formed on the surface of the cover glass 510 can adversely affect the display quality of the display panel 110.

In the front direction of the display panel 110, a common electrode to which a constant voltage is applied is widely disposed to prevent the influence of the electric field. Accordingly, the influence of the electric field in the front central region X of the cover glass 510 can be prevented through the common electrode of the display panel 110.

Meanwhile, in the side area of the display panel 110, it is difficult for the common electrode to sufficiently perform a role of preventing the influence of the electric field. When the ground coating process is normally performed, the conductive material 710 electrically connects the cover glass 510 and the ground electrode 520 through the conductive material 710, thereby minimizing the intensity of the electric field on the side and rear surfaces of the cover glass 510.

Figure 8A:
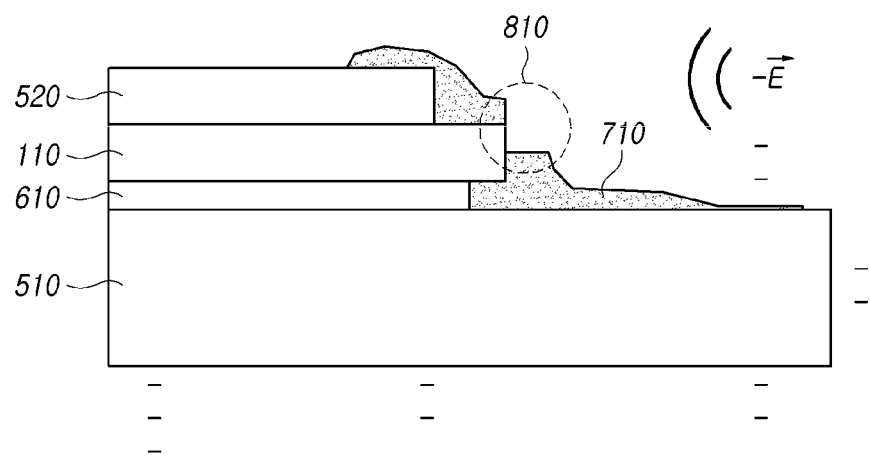
FIG. 8A is a view illustrating a ground defect of a cover glass based on the comparative example.

FIG. 8A is a view illustrating a ground defect of a cover glass.

Referring to FIG. 8A, when the grounding of the cover glass 510 is poorly performed, the cover glass 510 is not electrically connected to the ground electrode 520 or is unstably connected.

For example, when the ground coating process is poor, the conductive material 710 includes an open region 810, and the conductive material 710 is not connected from the rear surface of the cover glass 510 to the side surface and the rear surface of the ground electrode 520.

Accordingly, on the side surface and the rear surface of the cover glass 510, a relatively strong negative electric field can be formed compared to the situation where the ground coating process is normally performed.

Due to the negative electric field generated by the cover glass 510, an abnormal phenomenon of display quality can be visually recognized in the display panel 110. This abnormal phenomenon can occur because the amount of current flowing through the transistor disposed on the display panel 110 is changed due to the electric field formed on the surface of the cover glass 510.

For example, in the display panel 110, a phenomenon in which green light is strongly visually recognized (also referred to as a "green tint" phenomenon) can occur.

Referring to FIG. 8A, such a defect can be a problem caused by using an insufficient amount of the conductive material 710 in the ground coating process.

Figure 8B:
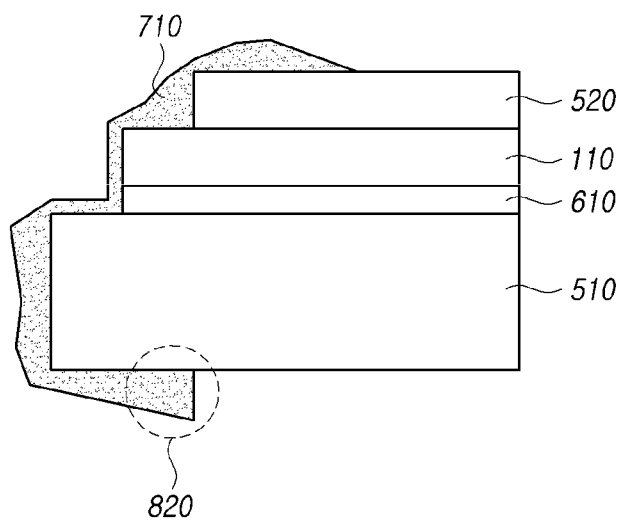
FIG. 8B is a diagram illustrating a defect generated by flowing a conductive material to a front surface of a cover glass based on the comparative example.

FIG. 8B is a diagram illustrating another type of defect, which is generated by flowing a conductive material to a front surface of a cover glass.

Referring to FIG. 8B, when an excessive amount of the conductive material 710 is positioned on the rear surface of the cover glass 510 in the ground coating process, the conductive material 710 can overflow onto the front surface of the cover glass 510.

In this situation, the excess conductive material 820 can be visually recognized on the front surface of the cover glass 510.

In particular, referring to FIGS. 5 and 8B together, in the display device, there can be a relatively large area (e.g., a right area of FIG. 5) and a relatively narrow area (e.g., a left area of FIG. 5) between the cover glass 510 and the ground electrode 520. The problem that the excess conductive material 820 is visually recognized can more easily occur in an area where the first interval d1 between the end of the cover glass 510 and the end of the display panel 110 is narrow.

Referring to FIG. 8B, in order to solve a problem in which the excess conductive material 820 is visually recognized, it can be considered to reduce the amount of the conductive material 710 used in the ground coating process.

However, when the amount of the conductive material 710 used in the ground coating process is reduced, the aforementioned ground defect can occur, and thus the frequency of occurrence of "green tint phenomenon" described in FIG. 8A can increase.

As mentioned above, there is a technical problem in that the display device 100 reducing the amount of the conductive material 710 electrically connecting the cover glass 510 and the ground electrode 520 and the display device 100 to protect from the influence of electric fields that can occur on the rear and/or side of the cover glass 510 should be provided together.

Figure 9:
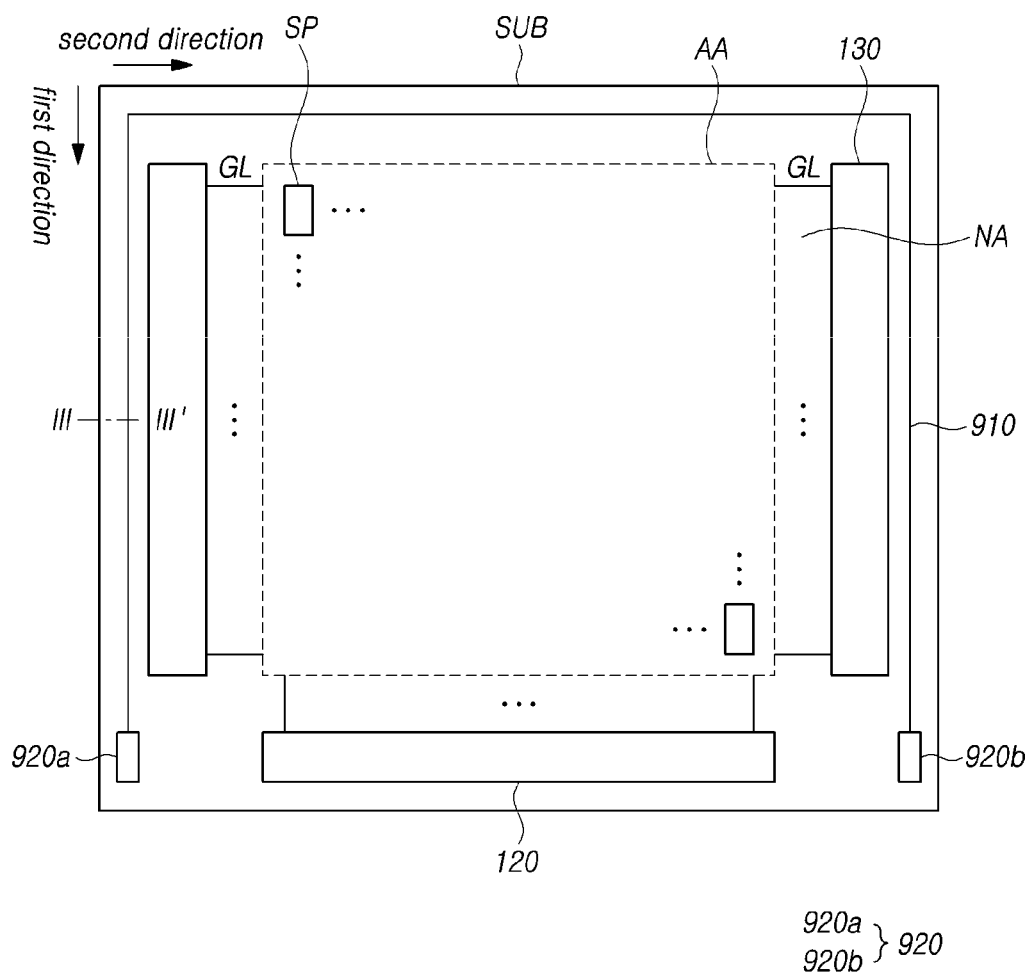
FIG. 9 is a diagram illustrating a display device including a multilayer shielding line according to an embodiment of the present disclosure.

FIG. 9 is a diagram illustrating a display device including a multilayer shielding line.

Referring to FIG. 9, a display device 100 according to embodiments of the present disclosure includes a multilayer shielding line 910 positioned in a non-display area NA outside the display area AA.

The multilayer shielding line 910 can be disposed in a ring shape surrounding or partially surrounding the display area AA. The ring shape can be disposed to surround, for example, three corners of the display area AA (e.g., left, upper, and right corners of the display area AA in FIG. 9).

For example, when the data line DL extends in the first direction and the gate line GL extends in the second direction, the multilayer shielding line 910 can extend in the first direction and the second direction in the non-display area NA.

Referring to FIGS. 5, 7, and 9, in the display device 100 according to embodiments of the present disclosure, a conductive material 710 can be positioned on a side surface of the multilayer shielding line 910.

A constant voltage can be applied to one end or opposite ends of the multilayer shielding line 910.

In addition, a pin 920 can be disposed on the substrate SUB. The pin 920 can be a pad.

The constant voltage can be applied to the pin 920. Alternatively, the pin 920 can be electrically connected to another circuit.

For example, pins 920 can include a first pin 920*a* and a second pin 920*b*. One end of the multilayer shielding line 910 can be electrically connected to the first pin 920*a*, and the other end of the multilayer shielding line 910 can be electrically connected to the second pin 920*b*. For example, the pins 920 can be directly connected to the multilayer shielding line 910 or can be electrically connected through a contact hole or the like. In some situations, the multilayer shielding line 910 and the first pin 920*a* and/or the second pin 920*b* can be connected to each other through a jumping structure. The multilayer shielding line 910 and the pins 920 can be positioned on the same layer or on different layers, or any one material layer constituting the multilayer shielding line 910 and the pins 920 can be positioned on the same layer.

For example, a constant voltage of the same voltage level can be applied to the first pin 920*a* and the second pin 920*b*. In this situation, a constant voltage of the same voltage level as the constant voltage applied to the first pin 920*a* and the second pin 920*b* can be applied to the multilayer shielding line 910.

As another example, a constant voltage of a constant voltage level can be applied to one of the first pin 920*a* and the second pin 920*b* (e.g., the first pin 920*a*). The other pin (e.g., the second pin 920*b*) can be electrically connected to a circuit that senses a voltage value input through the multilayer shielding line 910.

For example, the circuit can be a circuit capable of detecting whether a crack has occurred in the display panel 110 by using a point that a voltage input to the other pin varies according to a magnitude of a resistance of the multilayer shielding line 910.

The data driving circuit 120 can be implemented as a source driver integrated circuit (IC). The integrated circuit IC can be electrically connected to the first pin 920*a* and/or the second pin 920*b*.

The multilayer shielding line 910 can extend in the first direction and the second direction in the non-display area NA.

For example, the first direction can be a direction in which a plurality of data lines DL extend from the display area AA. The second direction can be a direction in which a plurality of gate lines GL extend from the display area AA. Conversely, the first direction can be a direction in which a plurality of gate lines GL extend from the display area AA, and the second direction can be a direction in which a plurality of data lines AA extend. Hereinafter, for convenience of description, the first direction will be assumed to be a direction in which a plurality of data lines DL extend.

As the multilayer shielding line 910 is positioned in the non-display area NA outside the display area AA, the influence of the electric field generated from the side surface of the cover glass 510 (see FIG. 5) can be alleviated. In other words, the multilayer shielding line 910 can effectively prevent a plurality of sub-pixels SP from being affected by an electric field that can be formed on the rear and/or side of the cover glass 510. In particular, the multilayer shielding line 910 is disposed to surround the display area AA, thereby effectively alleviating a phenomenon in which the display quality of the sub-pixel SP positioned at the outermost part of the display area AA is degraded.

Also, when the gate driving circuit 130 is formed in the non-display area NA on the substrate SUB in a gate-in-panel (GIP) type, the multilayer shielding line 910 can be located outside the gate driving circuit 130. The multilayer shielding line 910 can be disposed to surround both the gate driving circuit 130 and the display area AA.

The multilayer shielding line 910 can also alleviate a phenomenon in which the gate driving circuit 130 is affected by an electric field generated on a side surface of the cover glass 510 (see FIG. 5). Specifically, since the multilayer shielding line 910 is disposed outside the gate driving circuit 130 formed in the gate-in-panel (GIP) type, multiple transistors disposed on the gate driving circuit 130 can also be effectively prevented from being affected by electric fields formed on the rear and/or side of the cover glass 510.

Figure 10:
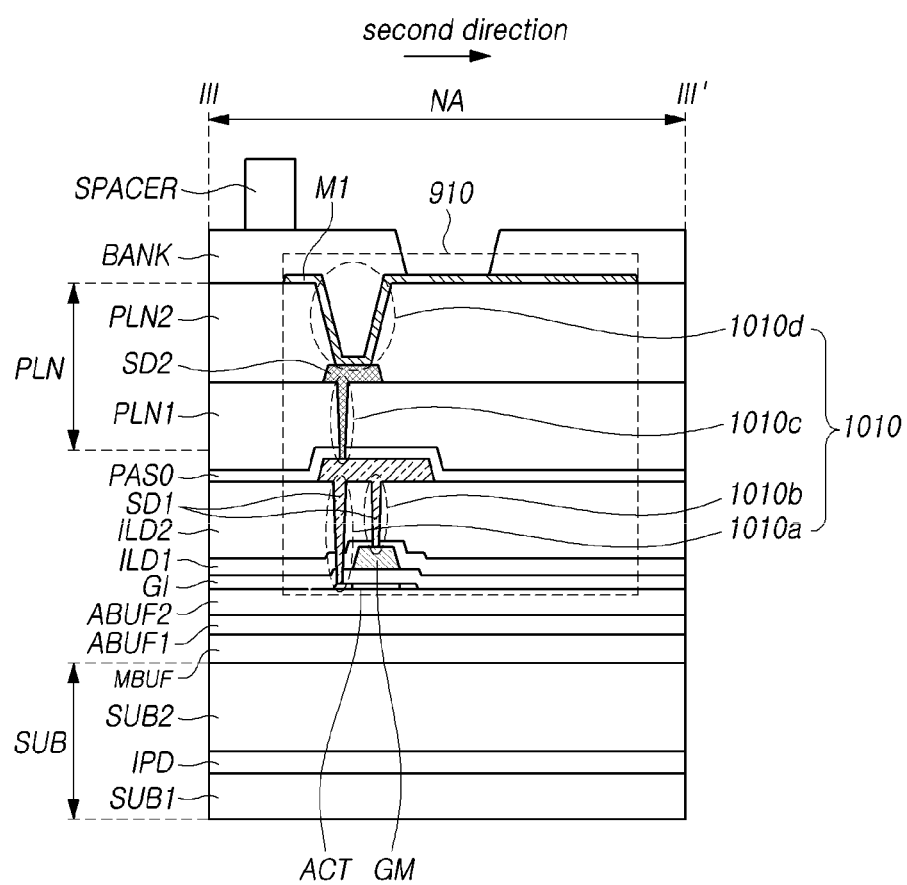
FIG. 10 is a cross-sectional view taken along line of the display device of FIG. 9 according to an embodiment of the present disclosure.

FIG. 10 is a cross-sectional view taken along line of the display device of FIG. 9.

Referring to FIG. 10, a display device according to embodiments of the present disclosure includes multilayer shielding lines 910 including patterns (e.g., ACT, GM, SD1, SD2, M1, etc.) disposed on different layers with interlayer insulating layers (e.g., GI, ILD1, ILD0, PAS0, PLN0, PLN2, etc.) interposed therebetween. Patterns constituting one multilayer shielding line 910 can be electrically connected. A constant voltage of the same voltage level can be applied to patterns constituting one multilayer shielding line 910.

Referring to FIG. 10, the interlayer insulating layer (e.g., GI, ILD1, ILD2, PAS0, PLN1, PLN2, etc.) can include a contact hole 1010, and the patterns (e.g., ACT, GM, SD1, SD2, M1, etc.) can be electrically connected through the contact hole 1010.

The contact hole 1010 can include at least one of the first to fourth contact holes 1010*a*, 1010*b*, 1010*c*, and 1010*d*. Referring to FIG. 10, the active layer ACT and the first source-drain electrode material pattern SD1 can be connected to each other in the first contact hole 1010*a*. In the second contact hole 1010*b*, the gate material layer GM can be connected to the first source-drain electrode material pattern SD1. The first source-drain electrode material pattern SD1 and the second source-drain electrode material pattern SD2 can be connected to each other in the third contact hole 1010*c*. The first metal pattern layer M1 and the second source-drain electrode material pattern SD2 can be connected to each other in the fourth contact hole 1010*d*.

Referring to FIG. 10, a substrate SUB, a multi-buffer layer MBUF on the substrate SUB, and a first active buffer layer ABUF1 and a second active buffer layer ABUF2 on the multi-buffer layer MBUF can be disposed in the non-display area NA of the display device 100 according to embodiments of the present disclosure.

In addition, the above-described light shield layer LS (see FIG. 3) can be further disposed on the first active buffer layer ABUF1 and the second active buffer layer ABUF2, but referring to FIG. 10, the light shield layer LS may not be disposed in at least a partial region of the non-display area NA.

For example, the light shield layer LS can be disposed in an area overlapping the gate driving circuit 130 (see FIG. 9) formed in the gate-in-panel (GIP) type in the non-display area NA, but may not be disposed in an area overlapping the multilayer shielding line 910.

Referring to FIG. 10, an active layer ACT and a gate insulating layer GI can be disposed on the second active buffer ABUF2 in the non-display area NA according to embodiments of the present disclosure.

The multilayer shielding line 910 can include an active layer ACT. The active layer ACT can have a channel region in a region overlapping the gate material layer GM. The active layer ACT can include a source region located on one side of the channel region and a drain region located on the other side of the channel region.

The source region or the drain region of the active layer ACT positioned in the non-display region NA can be in a conductive state. The source region or the drain region can be connected to the first source-drain electrode material pattern SD1.

The active layer ACT disposed in the non-display area NA can be disposed on the same layer as the active layer ACT disposed in the display area AA. For example, the active layer ACT disposed in the non-display area NA and the active layer ACT disposed in the display area AA can be formed in the same process.

The gate material layer GM can be disposed to overlap the active layer ACT with the gate insulating layer GI interposed therebetween.

One or more interlayer insulating layers ILD can be disposed between the gate material layer GM and the first source-drain electrode material pattern SD1. For example, referring to FIG. 10, a first interlayer insulating layer ILD1 and a second interlayer insulating layer ILD2 can be disposed between the gate material layer GM and the first source-drain electrode material pattern SD1. The first interlayer insulating layer ILD1 can be an inorganic insulating layer, and the second interlayer insulating layer ILD2 can be an organic insulating layer serving as a planarization layer.

The multilayer shielding line 910 can include the gate material layer GM.

The multilayer shielding line 910 can include the first source-drain electrode material pattern SD1.

Referring to FIG. 10, the first contact hole 1010a can be formed in the second interlayer insulating layer ILD2. The first contact hole 1010a can expose at least a portion of the active layer ACT.

The first source-drain electrode material pattern SD1 constituting the multilayer shielding line 910 can be electrically connected to the active layer ACT through the first contact hole 1010a.

Referring to FIG. 10, a second contact hole 1010b can be formed in the second interlayer insulating layer ILD2. The second contact hole 1010b can expose at least a portion of the gate material layer GM.

The first source-drain electrode material pattern SD1 constituting the multilayer shielding line 910 can be electrically connected to the gate material layer GM through a second contact hole 1010b.

The first source-drain electrode material pattern SD1 constituting the multilayer shielding line 910 can be electrically connected to the active layer ACT through the first contact hole 1010a, and can be electrically connected to the gate material layer GM through the second contact hole 1010b.

Referring to FIGS. 3 and 10, the gate material layer GM of the non-display area NA can be disposed on the same layer as the gate electrode GATE and the gate material layer GM of the display area AA. For example, the gate material layer GM and the gate electrode GATE can be formed in the same process.

Referring to FIGS. 3 and 10, the first source-drain electrode material pattern SD1 of the non-display area NA and the first source-drain electrode material pattern SD1 of the display area AA can be disposed on the same layer. For example, the first source-drain electrode material pattern SD1 disposed in the non-display area NA and the first source-drain electrode material pattern SD1 disposed in the display area AA can be formed in the same process.

Referring to FIG. 10, a passivation layer PAS0 is disposed to cover the first source-drain electrode material pattern SD1. A planarization layer PLN can be disposed on the passivation layer PAS0. The planarization layer PLN can include a first planarization layer PLN1 and a second planarization layer PLN2.

The multilayer shielding line 910 can include a second source-drain electrode material pattern SD2. The second source-drain electrode material pattern SD2 can be disposed on the first planarization layer PLN1.

A third contact hole 1010c can be formed in the first planarization layer PLN1. The third contact hole 1010c can expose at least a portion of the first source-drain electrode material pattern SD1.

The second source-drain electrode material pattern SD2 can be electrically connected to the first source-drain electrode material pattern SD1 through the third contact hole 1010c.

Referring to FIGS. 3 and 10, the second source-drain electrode material pattern SD2 disposed in the non-display area NA can be disposed on the same layer as the second source-drain electrode material pattern SD2 disposed in the display area AA. For example, the second source-drain electrode material pattern SD2 disposed in the non-display area NA and the second source drain electrode pattern SD2 disposed in the display area AA can be formed in the same process.

The second planarization layer PLN2 can be disposed to cover the second source-drain electrode material pattern SD2. A first metal pattern layer M1 and the bank BANK can be disposed on the second planarization layer PLN2.

The first metal pattern layer M1 disposed in the non-display area NA can be disposed on the same layer as the anode electrode AE of the light emitting device ED disposed in the display area AA. The first metal pattern layer M1 can be formed in the same process as the anode electrode AE of the light emitting device ED.

The fourth contact hole 1010d can be formed in the second planarization layer PLN2. The fourth contact hole 1010d can expose at least a portion of the second source-drain electrode material pattern SD2.

The first metal pattern layer M1 can be electrically connected to the second source-drain electrode material pattern SD2 through the fourth contact hole 1010d.

Referring to FIG. 10, the bank BANK can be disposed on the first metal pattern layer M1. The bank BANK can include an opening area, but unlike FIG. 10, the opening area may not be located in the non-display area NA.

An encapsulation layer can be further disposed on the bank BANK. For example, the first encapsulation layer PAS1, the second encapsulation layer PCL, and the third encapsulation layer PAS2 can be further disposed in the non-display area NA. (Refer to FIG. 3 described above).

Referring to FIG. 10, a spacer SPACER can be further positioned on the bank BANK. The spacer SPACER can be disposed along the edge of the display panel 110.

The spacer SPACER can be disposed in a display device 100 including an array substrate (substrate SUB of FIGS. 3 and 10) on which a pixel driving circuit such as a driving transistor is formed and a color filter substrate on which a color filter is formed.

For example, the display panel according to the example configurations of the present disclosure can be formed by bonding the array substrate and the color filter substrate. A sealing material for bonding the above-described two substrates can be injected between the array substrate and the color filter substrate. The spacer SPACER can be configured to prevent the sealing material from leaking out of the display panel 110 (e.g., acting as a type of retaining wall).

Further, referring to FIGS. 3 and 10, an electrode corresponding to a common electrode may not be disposed in the non-display area NA.

For example, a common electrode connected in common with two or more sub-pixels SP can be disposed in the display area AA, and the common electrode may not be disposed in an area overlapping the multilayer shielding line 910.

The common electrode can be disposed on the same layer as the pattern (e.g., the first metal pattern layer M1) disposed at the uppermost layer among the patterns included in the multilayer shielding line 910, or can be disposed higher than the pattern (e.g., ACT, GM, SD1, SD2, etc.) disposed at the uppermost layer.

The common electrode can be a cathode electrode of the light emitting device ED.

Specifically, the description is as follows. In the light emitting area EA of the display area AA, the anode electrode AE of the light emitting device ED, the light emitting layer EL, and the cathode electrode CE can be sequentially disposed to emit light. The cathode electrode CE can be a common electrode commonly positioned in two or more sub-pixels SP. A low potential common voltage ELVSS can be applied to the cathode electrode CE. As the cathode electrode CE is disposed on the front surface of the display area AA, the influence by the electric field formed on the front surface of the cover glass 510 described above can be effectively controlled.

Alternatively, the cathode electrode CE may not be positioned in the non-display area NA. Accordingly, various transistors located in the non-display area NA and sub-pixels SP located in the edge area of the display area AA can be affected by electric fields formed on the rear and/or side surfaces of the cover glass 510.

Referring to FIG. 10, patterns (e.g., ACT, GM, SD1, SD2, M1, etc.) constituting the multilayer shielding line 910 are positioned in a vertical direction, and these patterns are electrically connected. Accordingly, a constant voltage of the same voltage level can be applied to all these patterns, which together constitute the multilayer shielding line 910.

Referring to FIG. 10, a constant voltage is applied to patterns (e.g., ACT, GM, SD1, SD2, M1, etc.) disposed on different layers with at least one interlayer insulating layer (e.g., GI, ILD1, ILD2, PAS0, PLN1, PLN2, etc.) interposed therebetween. Accordingly, transistors located in the non-display area NA and sub-pixels SP located at the edge of the display area AA can be less affected by an external electric field. For example, the various conductive patterns ACT, GM, SD1, SD2, M1, etc. can be electrically connected together to form parts of the multi-layer shield line 910, which can act as a type of distributed, branching wire that extends around the outer edges of the display device and penetrates deep within the device (e.g., similar to the roots of a tree forming a type of fence enclosure), thus being able to protect internal components from and prevent undue influence from an external electric field that can be generated on the surface of the display device form repeated touching from a user (e.g., effectively acting as type of electric moat or barrier wall surrounding and protecting components within the device).

Accordingly, the multilayer shielding line 910 can effectively solve defects in display quality that can be caused by electric fields formed on the rear and/or side surfaces of the cover glass 510.

In addition, referring again to FIG. 10, when the multilayer shielding line 910 includes the first metal pattern layer M1, the first metal pattern layer M1 can extend in a display region direction (e.g., a second direction in FIG. 10) on the second planarization layer PLN2.

For example, at least a part of the first metal pattern layer M1 can be located in a region overlapping at least one of the active layer ACT, the gate material layer GM, the first source-drain electrode material pattern SD1, and the second source-drain electrode material pattern SD2. The remaining part of the first metal pattern layer M1 can extend in the direction of the display area AA and can be located in a region that does not overlap any of the active layer ACT, the gate material layer GM, the first source-drain electrode material pattern SD1, and the second source-drain electrode material pattern SD2.

Accordingly, it is possible to more effectively prevent the display quality from deteriorating due to the electric field formed on the rear and/or side of the cover glass 510 described above.

Common voltages (e.g., ELVDD and ELVSS) for driving a plurality of sub-pixels SP can be applied to the multilayer shielding line 910.

A constant voltage of a preset voltage level can be applied to the multilayer shielding line 910 to detect fine cracks that can occur in the display panel 110.

Figure 11:
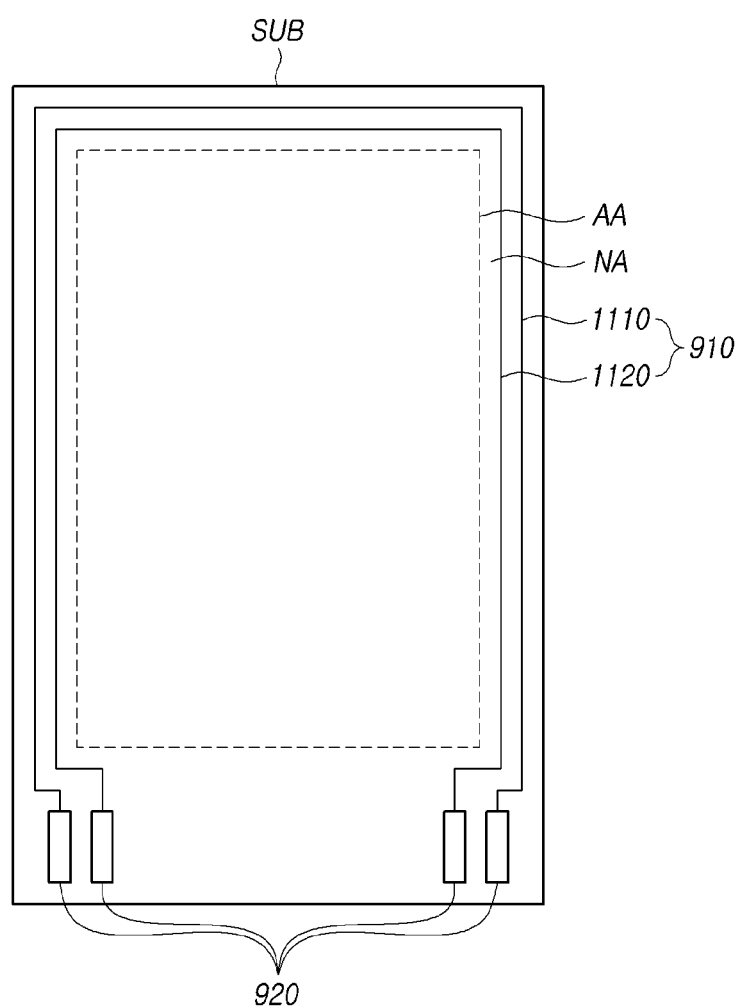
FIG. 11 is a diagram illustrating an embodiment of a multilayer shielding line according to an embodiment of the present disclosure.

FIG. 11 is a diagram illustrating an embodiment of a multilayer shielding line.

Referring to FIG. 11, the multilayer shielding line 910 can also include a panel crack detection line (PCD; 1110).

A constant voltage is applied to one end of the panel crack detection line 1110. When fine cracks occur in the panel and at least a part of the panel crack detection line 1110 is exposed, the resistance value of the panel crack detection line 1110 is changed.

When the voltage at the other end of the panel crack detection line 1110 is measured, the degree of voltage drop can be known. Accordingly, it is possible to effectively detect whether fine cracks have occurred in the panel by calculating the amount of change in the resistance of the panel crack detection line 1110.

Referring to FIG. 11, the pin 920 electrically connected to one end of the panel crack detection line 1110 can apply a constant voltage, and the pin 920 electrically connected to the other end of the panel crack detection line 1110 can be electrically connected to a circuit for detecting a voltage value.

Cracks generated on the panel often occur from the outermost part of the panel. Accordingly, the panel crack detection line 1110 can be located outside the common voltage routing wiring 1120.

In addition, two or more different patterns in which the panel crack detection line 1110 is positioned with at least one insulating layer interposed therebetween can be included. Accordingly, when a crack occurs in any of the layers on which two or more patterns are located, the resistance value of the entire panel crack detection line 1110 can vary. Accordingly, it is possible to more effectively detect fine cracks that can occur in the display panel 110.

At the same time, a constant voltage is applied to the panel crack detection line 1110. Accordingly, the panel crack detection line 1110 can also function as a multilayer shielding line 910 that minimizes the influence of an electric field from the outside of the display panel 110 toward the display panel 110. For example, the multilayer shielding line 910 can provide dual functions of detecting cracks and also protecting internal components from the influence of an electric field generated on the outside of the display panel.

Referring to FIG. 11, the multilayer shielding line 910 can include a common voltage routing wiring 1120.

The common voltage routing wiring 1120 can be a line to which a high potential common voltage (e.g., ELVDD) or a low potential common voltage (e.g., ELVSS) is applied. A constant voltage can be applied to the pins 920 at opposite ends electrically connected to the common voltage routing wiring 1120.

The common voltage (e.g., ELVDD, ELVSS, etc.) is commonly applied to a plurality of sub-pixels SP disposed in the display area AA. The common voltage routing wiring 1120 can be disposed in the non-display area NA and can be disposed in the form of a ring partially or fully surrounding the display area AA.

The common voltage routing wiring 1120 is preferably located close to the display area AA because the common voltage routing wiring 1120 is a wiring that transmits a common voltage applied to the sub-pixel SP. Accordingly, the common voltage routing wiring 1120 can be located inside the panel crack detection line 1110 and can be located closer to the display area AA.

In addition, the common voltage routing wiring 1120 can be disposed in a ring shape in the non-display area NA. Due to the resistance of the common voltage routing wiring 1120 itself, heat generation can occur in the common voltage routing wiring. In this situation, a problem of increased power consumption can occur.

The common voltage routing wiring 1120 according to an embodiment of the present disclosure can include two or more different patterns in which at least one insulating layer is interposed therebetween. Accordingly, there is substantially the same effect as increasing the cross-sectional area of the common voltage routing wiring 1120, and accordingly, resistance can be reduced. For this reason, there is an effect of reducing power consumption.

At the same time, a constant voltage (e.g., ELVDD, ELVSS, etc.) is applied to the common voltage routing wiring 1120. Accordingly, the common voltage routing wiring 1120 can also function as a multilayer shielding line 910 that minimizes the influence of an electric field from the outside of the display panel 110 toward the inside of the display panel 110 (e.g., the direction of the display area AA).

Figure 12:
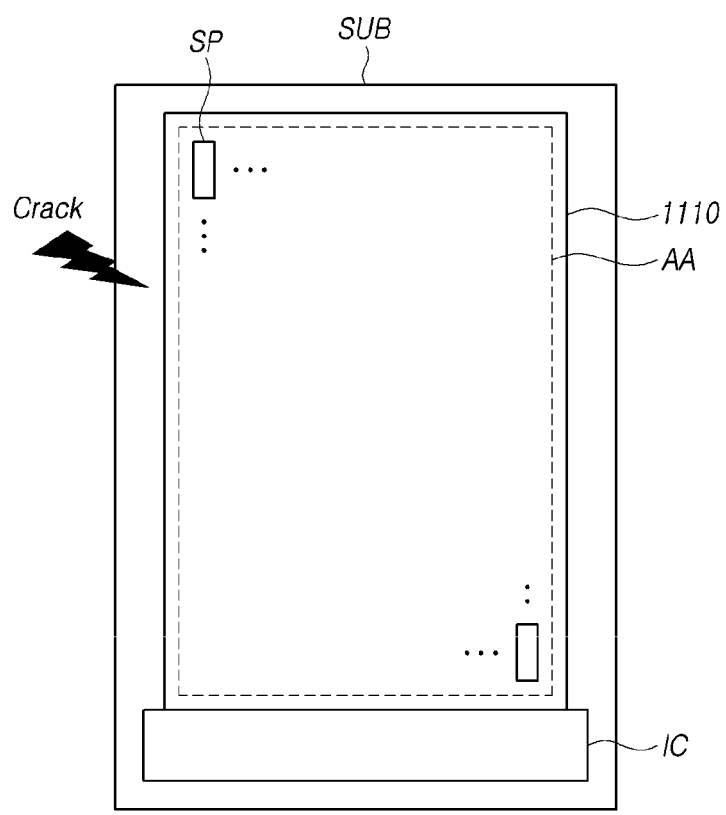
FIG. 12 is a diagram illustrating a panel crack detection line according to embodiments of the present disclosure.

FIG. 12 is a diagram illustrating a panel crack detection line according to embodiments of the present disclosure.

Referring to FIG. 12, the panel crack detection line 1110 can be electrically connected to the integrated circuit IC.

The integrated circuit IC can apply a constant voltage to one end of the panel crack detection line 1110. The integrated circuit IC can detect a voltage value applied to the other end of the panel crack detection line 1110. Although FIG. 12 illustrates that opposite ends of the panel crack detection line 1110 are connected to the same integrated circuit IC, opposite ends of the panel crack detection line 1110 can be connected to different integrated circuits ICs, respectively.

The integrated circuit IC can calculate the resistance value of the panel crack detection line 1110 according to the voltage value applied to the other end of the panel crack detection line 1110. The integrated circuit IC can detect whether a fine crack or the like has occurred in the corresponding display panel 110 by referring to a previously stored lookup table (LUT) and comparing the detected voltage with one or more predetermined voltages.

The integrated circuit IC can be formed on the substrate SUB, but can be disposed on a separate circuit board.

Figure 13:
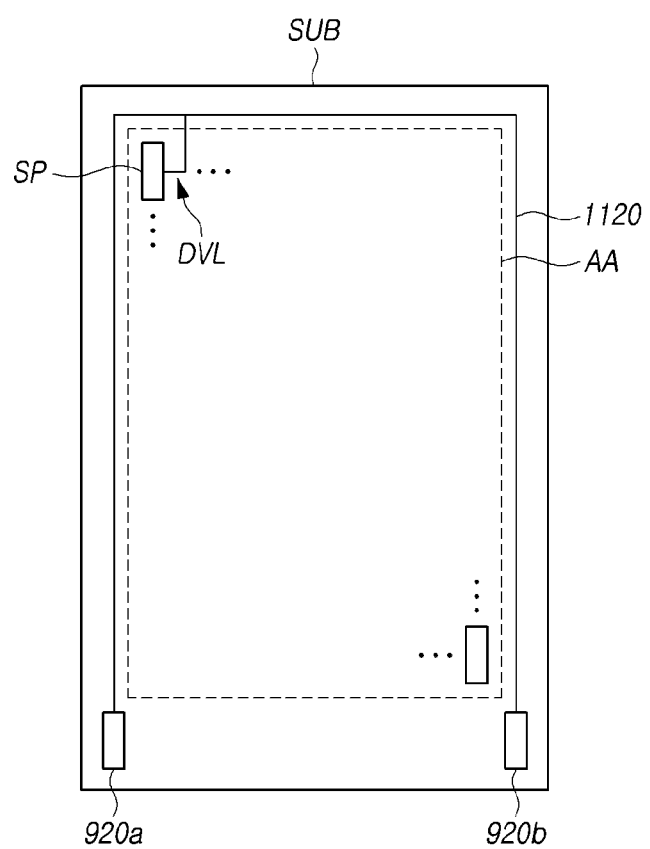
FIG. 13 is a diagram for describing a common voltage routing wiring according to embodiments of the present disclosure.

FIG. 13 is a diagram for describing a common voltage routing wiring according to embodiments of the present disclosure.

Referring to FIG. 13, the common voltage routing wiring 1120 can be disposed in a ring shape surrounding an outer periphery of the display area AA, in which the ring shaped common voltage routing wiring 1120 can fully surround or partially surrounding the outer periphery of the display AA (e.g., wiring 1120 can form a crescent shape or surround three or more sides of a rectangular shaped display area AA).

The first pin 920a and the second pin 920b can be electrically connected to opposite ends of the common voltage routing wiring 1120. The first pin 920a and/or the second pin 920b can be electrically connected to the above-described integrated circuit IC (see FIG. 12).

A constant voltage of the same voltage level can be applied to the first pin 920a and the second pin 920b. The constant voltage can be, for example, a high potential common voltage (ELVDD) or a low potential common voltage (ELVSS), or a voltage level set at a value between the high potential common voltage (ELVDD) or a low potential common voltage (ELVSS).

The common voltage routing wiring 1120 can be electrically connected to the sub-pixel SP through the driving voltage line DVL.

For example, the high potential common voltage (ELVDD) applied to the common voltage routing line 1120 can be applied to a plurality of sub-pixels SP through the driving voltage line DVL.

Embodiments of the present disclosure described above will be briefly described as follows.

According to aspects of the present disclosure, there is a display device 100 including a substrate SUB, a light emitting device ED disposed on the substrate SUB and disposed in a sub-pixel SP of a display area AA, and a multilayer shielding line 910 disposed on the substrate SUB and electrically connecting a plurality of patterns with each other (e.g., ACT, GM, SD1, SD2, M1, etc.), which are disposed on different layers and have one or more interlayer insulating layers (e.g., GI, ILD1, ILD2, PAS0, PLN1, PLN2, etc.) interposed therebetween in a non-display area NA around the display area AA.

According to the aspects of the present disclosure, there can be a display device 100 in which a constant voltage of the same voltage is applied to the plurality of patterns (e.g., ACT, GM, SD1, SD2, M1, etc.).

According to the aspects of the present disclosure, there can be a display device 100, in which the interlayer insulating layer includes a contact hole 1010, and the plurality of patterns (e.g., ACT, GM, SD1, SD2, M1, etc.) are electrically connected through the contact hole.

According to the aspects of the present disclosure, there can be a display device 100 further including a data line extending in a first direction and supplying a data voltage Vdata to the sub-pixel SP and a gate line GL extending in a second direction and supplying a gate voltage to the sub-pixel SP, in which the plurality of patterns (e.g., ACT, GM, SD1, SD2, M1, etc.) are disposed to extend in the first direction and the second direction in the non-display area NA.

According to the aspects of the present disclosure, there can be a display device 100 further including a gate driving circuit 130 configured to supply a gate signal to the gate line GL, in which the multilayer shielding line 910 is disposed outside the gate driving circuit 130.

According to the aspects of the present disclosure, there can be a display device 100 further including a circuit IC configured to measure a voltage applied to the multilayer shielding line 910.

According to the aspects of the present disclosure, there can be a display device 100, in which a driving voltage line DVL to which a common voltage (e.g., ELVDD, ELVSS) applied in common to two or more sub-pixels SP is applied, in which the driving voltage line is electrically connected to the multilayer shielding line 910.

According to the aspects of the present disclosure, there can be a display device 100, further including a display panel 110 including the display area AA and the non-display area NA, a cover glass 510 disposed on the front surface of the display panel 110, a ground electrode 520 in which at least a part is positioned on the rear surface of the display panel 110 and a conductive material 710 disposed on a side surface of the multilayer shielding line 910 and configured to electrically connect the cover glass 510 to the ground electrode 520.

According to the aspects of the present disclosure, there can be a display device 100, in which in the non-display area NA, an active layer ACT including a channel region, a source region located at one side of the channel region, and a drain region located at the other side of the channel region, a source-drain electrode material pattern (e.g., SD1, SD2) electrically connected to the active layer ACT and a gate material layer GM disposed to overlap the channel region with a gate insulating layer GI interposed therebetween are disposed, in which the plurality of patterns include at least one or more of the active layer ACT, the source-drain electrode material pattern (e.g., SD1, SD2), and the gate material layer GM.

According to the aspects of the present disclosure, there can be a display device 100, in which the source-drain electrode material pattern (e.g., SD1, SD2) is electrically connected to the source region or the drain region of the active layer ACT.

According to the aspects of the present disclosure, there can be a display device 100, in which the active layer ACT, the source-drain electrode material pattern (e.g., SD1, SD2), and the gate material layer GM are electrically connected with each other.

According to the aspects of the present disclosure, there can be a display device 100, in which the sub-pixel SP further includes a driving transistor DRT configured to drive the light emitting device ED, in which the driving transistor DRT includes, an active layer ACT disposed on the same layer as the active layer ACT of the multilayer shielding line 910, a source-drain electrode material pattern (e.g., SD1, SD2) electrically connected to the active layer ACT of the driving transistor DRT and disposed on the same layer as the source-drain electrode material pattern (e.g., SD1, SD2) of the multilayer shielding line 910, and a gate electrode GATE disposed to overlap the active layer ACT of the driving transistor DRT with the gate insulating layer GI interposed therebetween.

According to the aspects of the present disclosure, there can be a display device 100, in which the multilayer shielding line 910 includes a first metal pattern layer M1 of the same material as the first electrode (e.g., AE) of the light emitting device ED.

According to the aspects of the present disclosure, there can be a display device 100, in which the first metal pattern layer M1 is disposed to extend from an area positioned to overlap the active layer ACT, the gate material layer GM, and the source-drain electrode material pattern (e.g., SD1, SD2) toward the display area AA.

According to the aspects of the present disclosure, there can be a display device 100, in which in the display area AA, a common electrode (e.g., CE) connected in common with two or more sub-pixels SP is disposed, and the common electrode is disposed in a region that does not overlap the multilayer shielding line 910, and is disposed above the pattern positioned at the uppermost layer (e.g., M1) of the multilayer shielding line 910.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display apparatus comprising;
    a light emitting device disposed on a substrate and being located in a sub-pixel of a display area; and
    a multilayer shielding line disposed on the substrate, the multilayer shielding line electrically connecting a plurality of conductive patterns with each other, the plurality of conductive patterns being disposed on different layers with an interlayer insulating layer interposed between at least some of the plurality of conductive patterns,
    wherein the multilayer shielding line is disposed in a non-display area and at least partially surrounds the display area, and
    wherein the display area includes a common electrode connected in common with two or more sub-pixels, and the common electrode is disposed in a region that does not overlap with the multilayer shielding line, and the common electrode is located above a pattern positioned at an uppermost layer of the multilayer shielding line.

2. The display apparatus of claim 1, wherein the multilayer shielding line is configured to receive a voltage level and protect electrical components within the display apparatus from being influenced by an electric field that is generated on a surface of the display apparatus.

3. The display apparatus of claim 1, wherein the plurality of conductive patterns constitute at least a portion of the multilayer shielding line and are configured to receive a same voltage level.

4. The display apparatus of claim 1, wherein the interlayer insulating layer includes a contact hole, and wherein the plurality of conductive patterns are electrically connected to each other via the contact hole.

5. The display apparatus of claim 1, further comprising:
a data line extending in a first direction and being configured to supply a data voltage to the sub-pixel; and
a gate line extending in a second direction and being configured to supply a gate voltage to the sub-pixel,
wherein the plurality of conductive patterns are disposed to extend in the first direction and the second direction in the non-display area.

6. The display apparatus of claim 5, further comprising a gate driving circuit configured to supply a gate signal to the gate line,
wherein the multilayer shielding line is disposed outside the gate driving circuit.

7. The display apparatus of claim 1, further comprising a circuit configured to measure a voltage applied to the multilayer shielding line for detecting a crack in the display apparatus.

8. The display apparatus of claim 1, wherein a driving voltage line configured to receive a common voltage applied in common to two or more sub-pixels, and
wherein the driving voltage line is electrically connected to the multilayer shielding line.

9. The display apparatus of claim 1, further comprising:
a display panel including the display area and the non-display area;
a cover glass disposed on a front surface of the display panel;
a ground electrode including at least a part that is positioned on a rear surface of the display panel; and
a conductive material configured to electrically connect the cover glass with the ground electrode.

10. The display apparatus of claim 1, wherein the non-display area includes:
an active layer including a channel region, a source region located at one side of the channel region, and a drain region located at the other side of the channel region;
a source-drain electrode material pattern electrically connected with the active layer; and
a gate material layer disposed to overlap the channel region with a gate insulating layer interposed between the gate material later and the channel region,
wherein the plurality of conductive patterns include at least one of the active layer, the source-drain electrode material pattern, and the gate material layer.

11. The display apparatus of claim 10, wherein the source-drain electrode material pattern is electrically connected to the source region or the drain region of the active layer.

12. The display apparatus of claim 11, wherein the plurality of conductive patterns include the active layer, the source-drain electrode material pattern, and the gate material layer being electrically connected with each other.

13. The display apparatus of claim 10, wherein the sub-pixel further includes a driving transistor configured to drive the light emitting device, and
wherein the driving transistor includes:
an active layer disposed on a same layer as the active layer of the multilayer shielding line,
a source-drain electrode material pattern electrically connected to the active layer of the driving transistor and disposed on a same layer as the source-drain electrode material pattern of the multilayer shielding line, and
a gate electrode disposed to overlap the active layer of the driving transistor with the gate insulating layer being interposed between the gate electrode and the active layer.

14. The display apparatus of claim 10, wherein the multilayer shielding line includes a first metal pattern layer that is made of a same material as the first electrode of the light emitting device.

15. The display apparatus of claim 14, wherein the first metal pattern layer extends from an area overlapping with the active layer, the gate material layer, and the source-drain electrode material pattern toward the display area.

16. A display apparatus, comprising:
a display panel including an active area and a non-active area, the active area including a plurality of sub-pixels; and
a multilayer shielding line disposed in the non-active area, the multilayer shielding line at least partially surrounding the active area,
wherein the multilayer shielding line includes a plurality of conductive patterns that are disposed on different layers within the display panel, and the plurality of conductive patterns are electrically connected with each other,
wherein the plurality of conductive patterns include at least one transistor and a first metal pattern layer located above the at least one transistor,
wherein a gate electrode of the at least one transistor is directly connected to a source electrode or a drain electrode of the at least one transistor, and
wherein the first metal pattern layer, the gate electrode, the source electrode and the drain electrode are configured to receive a same voltage and prevent an influence of an electric field generated on a surface of the display device from damaging other circuit components located within the display area.

17. The display apparatus of claim 16, further comprising a crack detection circuit electrically connected to the multilayer shielding line,
wherein the multilayer shielding line is configured to perform dual functions of detecting a crack in the display panel and preventing an influence of an electric field generated on a surface of the display apparatus from damaging other circuit components located within the display area.

18. The display apparatus of claim 16, wherein the multilayer shielding line surrounds three sides of the display area,
wherein a first end of the multilayer shielding line is connected to a first ping and a second end of the multilayer shielding line is connected to a second pin, and
wherein first and second pins are configured to receive a same constant voltage.

* * * * *